United States Patent
Wong et al.

(10) Patent No.: US 7,033,516 B2
(45) Date of Patent: *Apr. 25, 2006

(54) INEXPENSIVE FABRICATION OF LARGE-AREA PIXEL ARRAYS FOR DISPLAYS AND SENSORS

(75) Inventors: William S. Wong, San Carlos, CA (US); Robert A. Street, Palo Alto, CA (US); Stephen D. White, Santa Carla, CA (US); Robert Matusiak, Sunnyvale, CA (US)

(73) Assignee: Xerox Corporation, Stamford, CT (US)

(*) Notice: Subject to any disclaimer, the term of this patent is extended or adjusted under 35 U.S.C. 154(b) by 71 days.

This patent is subject to a terminal disclaimer.

(21) Appl. No.: 10/334,595

(22) Filed: Dec. 30, 2002

(65) Prior Publication Data

US 2003/0134516 A1 Jul. 17, 2003

Related U.S. Application Data

(63) Continuation-in-part of application No. 09/838,684, filed on Apr. 19, 2001, now Pat. No. 6,872,320.

(51) Int. Cl.
*B44C 1/22* (2006.01)

(52) U.S. Cl. .............. 216/13; 216/41; 216/42; 216/43; 438/706; 438/725

(58) Field of Classification Search .......... 438/706, 438/710, 745, 750, 725; 216/13, 41, 42, 43
See application file for complete search history.

(56) References Cited

U.S. PATENT DOCUMENTS

| | | | | |
|---|---|---|---|---|
| 4,665,492 A | 5/1987 | Masters | ............ | 364/468 |
| 4,767,489 A | 8/1988 | Lindner | ............ | 156/345 |
| 4,943,818 A | 7/1990 | Hotomi | ............ | 347/99 |
| 5,576,135 A | 11/1996 | Nishikawa | ............ | 430/126 |
| 5,591,490 A | 1/1997 | Quate | ............ | 347/46 |
| 5,635,037 A | 6/1997 | Chu et al. | ............ | 204/192.35 |
| 5,660,624 A | 8/1997 | Dry | ............ | 106/677 |
| 5,680,185 A * | 10/1997 | Kobayashi et al. | ............ | 349/88 |
| 5,695,658 A | 12/1997 | Alwan | ............ | 216/42 |
| 5,700,316 A | 12/1997 | Pontes et al. | ............ | 347/99 |

(Continued)

FOREIGN PATENT DOCUMENTS

| | | |
|---|---|---|
| EP | 0 568841 A1 | 11/1993 |
| EP | 0 952513 A1 | 10/1999 |
| EP | 1040916 | 4/2000 |
| JP | 55138841 | 10/1980 |

OTHER PUBLICATIONS

Hayes, Donald J., Wallace, David B., and Cox, W. Royall, MicroFab Technologies, Inc., "MicroJet Printing of Solder and Polymers for Multi–Chip Modules and Chip–Scale Packages", IMAPS '99, pp. 1–6.

Hayes, Donald J. and Wallace, David B., MicroFab Technologies, Inc., "Solder Jet Printing for Low Cost Wafer Bumping".

Hayes, Donald J., Cox, W. Royall and Grove, Michael E., MicroFab Technologies, Inc., "Low–Cost Display Assembly and Interconnect Using Ink–Jet Printing Technology", Display Works '99, pp. 1–4.

(Continued)

*Primary Examiner*—Lan Vinh
(74) *Attorney, Agent, or Firm*—Kent Chen

(57) ABSTRACT

A method and system for fabricating an array of electronic devices, typically a display or sensor is described. In the method, a droplet source ejects droplets of a masking material for deposit on a thin film or substrate surface to mask an element of the array of electronic devices. The temperature of the thin-film or substrate surface is controlled such that the droplets rapidly freeze upon contact with the thin-film or substrate surface. The thin-film or substrate is then etched. After etching the masking material is removed.

30 Claims, 11 Drawing Sheets

U.S. PATENT DOCUMENTS

| | | | |
|---|---|---|---|
| 5,784,189 A * | 7/1998 | Bozler et al. | 359/254 |
| 5,852,975 A | 12/1998 | Miyabe et al. | 101/463.1 |
| 5,895,582 A | 4/1999 | Wilson et al. | 216/42 |
| 5,898,446 A | 4/1999 | Moriyama | 347/46 |
| 6,061,117 A * | 5/2000 | Horie et al. | 349/156 |
| 6,165,406 A | 12/2000 | Jang et al. | 264/308 |
| 6,165,833 A * | 12/2000 | Parekh et al. | 438/240 |
| 6,196,672 B1 | 3/2001 | Ito et al. | 347/88 |
| 6,386,671 B1 | 5/2002 | Huston et al. | 347/16 |
| 6,401,002 B1 | 6/2002 | Jang et al. | 700/119 |
| 2001/0041339 A1 | 11/2001 | Anderson et al. | 435/6 |
| 2002/0154187 A1 | 10/2002 | Wong et al. | 347/17 |

OTHER PUBLICATIONS

Szczech, J.B., Megaridis, C.M;, Gamota, D.R., Zhang, J;, M.E. Department, University of Illinois at Chicago, IL.; Motorola Inc., Schaumburg, IL.; "Fine–Line Conductor Manufacturing Using Advanced Drop–on–Demand PZT Printing Technology", Jun. 27, 2000, pp. 1–32.

Madou, M. Fundamentals of Microfabrication, Boca Raton, Florida, CRC Press LLC, 1997, p. 3–4. TK7836.M33.

"Solder Jet Technology Development, NIST/ATP Project No. 93–01–0183", Pacific NW Pollution Prevention Resource Center Pollution Prevention Research Projects Database, Sep. 1999.

Wallace, David B. and Hayes, Donald J., MicroFab Technologies, Inc., "Solder Jet Technology Update", Proceedings ISHM 97, pp. 1–4.

Wallace, David B. and Hayes, Donald J. MicroFab Technologies, Inc., "Solder Jet Printing of Micropads and Vertical Interconnects", pp. 1–10.

Wolf, S. and Tauber, R.N., Silicon Processing for the VLSI Era, vol. 1, pp. 564–565.

http://www.webelements.com/webelements/elements/text/ln/heat.html; Indium thermal Properties and temperatures.

* cited by examiner

INEXPENSIVE FABRICATION OF LARGE-AREA PIXEL ARRAYS FOR DISPLAYS AND SENSORS

RELATED APPLICATIONS

This application is a continuation in part of U.S. patent application Ser. No. 09/838,684 entitled "Method For Printing Etch Masks Using Phase-Change Materials" filed Apr. 19, 2001, now U.S. Pat. No. 6,872,320. This application is also related to U.S. patent application Ser. No. 09/838,685 entitled "Apparatus for Printing Etch Masks Using Phase-Change Materials" also filed Apr. 19, 2001, now U.S. Pat. No. 6,742,884.

BACKGROUND

In recent years, the increasingly widespread use of display device alternatives to the cathode ray tube (CRT) has driven the demand for large-area electronic arrays. In particular, amorphous silicon and laser recrystallized poly-silicon are used to drive liquid crystal displays commonly used in laptop computers. However, fabricating such large-area arrays is expensive. A large part of the fabrication cost of the large-area arrays arises from the expensive photolithographic process used to pattern the array. In order to avoid such photolithographic processes, direct marking techniques have been considered an alternative to photolithography.

Examples of direct marking techniques used in place of photolithography include utilizing a xerographic process to deposit a toner that acts as an etch mask and using an ink-jet printhead to deposit a liquid mask (H. Gleskova, R. Konenkamp, S. Wagner, and D. Shen, Electron. Device Lett 17,264 (1996)). Both techniques have corresponding problems. Toner materials are hard to control and difficult to remove after deposition while controlling feature size of a printed liquid mask is difficult.

Small printed features have been obtained using ink-jet printheads. Special piezoelectric ink-jet printheads allow generation of low droplet volumes (W. S. Wong, S. Ready, R. Matusiak, S. D. White, J-P. Lu, J. Ho, and R. A. Street, Appl. Phys. Lett. 80, 610 (2002)). However, even with the special printhead, the small size of features critical to the fabrication of large-area arrays has been difficult to achieve because of the surface tension between the droplet and the wetted surface. Typically, complete wetting is needed to form a good contact in order to prevent undercutting of the printed mask. However, as the surface is wetted, the liquid droplet tends to spread out making it difficult to control feature size. When used to pattern elements on a substrate, the droplet spreading results in undesirably large printed feature sizes. Decreasing the wetting properties of the substrate surface results in unreliable patterning due to poor adhesion of the droplet to the substrate. The poor adhesion can cause defects such as discontinuities in lines being fabricated. Variation in wetting properties across a substrate also presents problems as the droplet size must be adjusted to accommodate different materials to be patterned.

Thus an improved method for masking a substrate to be etched is needed.

SUMMARY OF THE INVENTION

The present invention relates generally to the field of device processing. In particular the invention relates to a method and apparatus for manufacturing a large area display and sensor devices based on the approach of printed etch-mask patterning. During the printed etch-mask patterning process, a surface is masked by ejecting droplets of a phase-change masking material from a droplet source onto a surface to be modified or etched. In order to avoid extended wetting and still achieve improved adhesion between the masking material and the surface to be etched; the surface is maintained at a temperature such that the masking material remains in a liquid phase for only a brief period after contact with the surface.

In one embodiment of the invention, the temperature of the surface to be etched is maintained below the freezing point of the phase-change masking material such that after deposition, the masking material rapidly converts from a liquid to a solid. In a second embodiment, the temperature of the surface to be etched is maintained above the boiling point of a liquid that carries a suspended masking material such that the liquid carrier rapidly evaporates after contact with the surface to be etched. One particularly suitable embodiment of the invention utilizes a phase-change organic material that solidifies at room temperature making such phase-change organic materials suitable for room temperature operation of the described processes.

After deposition of the masking material, the surface is etched to remove material not masked by droplets of the phase-change masking material. After etching the surface masked by the phase-change masking material, the phase-change masking material is removed from the surface.

BRIEF DESCRIPTION OF THE DRAWINGS

A more complete appreciation of the invention may be more readily understood by referring to the detailed description and the accompanying drawings.

DETAILED DESCRIPTION

Figure 1:
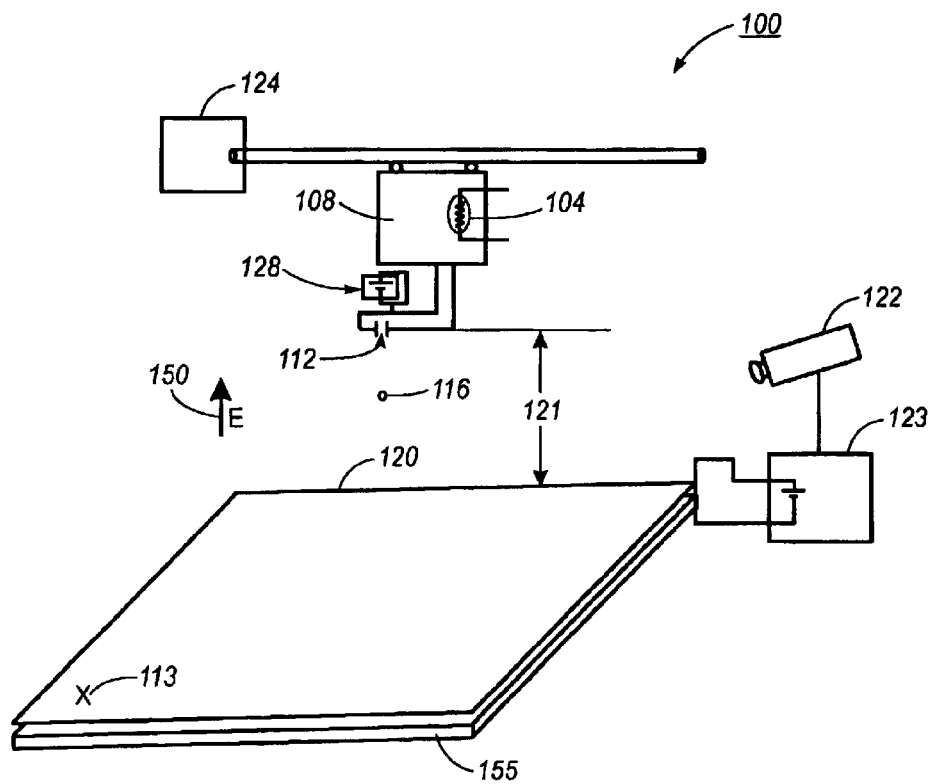
FIG. 1 shows a system that controls substrate temperature while depositing a phase-change-masking material onto the substrate in preparation for substrate etching.

In the following detailed description a method and system of forming a two dimensional pixel circuit will be described. As used herein, a two dimensional pixel circuit should be broadly defined and includes the array of pixels itself, the circuitry in each individual pixel, as well as supporting circuitry, including but not limited to the circuitry used to address each pixel, filter the light from each pixel and otherwise support operation of each pixel. The array of pixels are typically active and/or passive matrix circuits used in display devices, usually large area display devices as well as large-area sensors.

One example of forming the two dimensional pixel circuit uses printed etch-mask patterning. The system forms elements in the display device. Elements may include any feature used in the display device, typical examples of elements include, but are not limited to, the gate, source, and drain of transistors as well as address lines in the display used to address the transistors. The described system controls the temperature of a surface to be etched such that when a droplet source deposits droplets of phase-change masking material onto the surface of the substrate to be etched, the droplets remain in a liquid state for only a very brief period of time. In one embodiment, this is achieved by maintaining the temperature of the substrate below the freezing point of the phase change masking material.

As used herein, the term "phase-change masking material" refers to compounds or elements that changes in phase from a liquid to a solid, or in some embodiments from a liquid to a gas. In one embodiment of the invention, the phase change material have low melting points (also called freezing point) below 150° C. with a narrow transition temperature range. The phase-change masking material may also be mixtures or dispersions without precise freezing temperatures. However, even without specific freezing temperatures, these materials still retain the characteristic of transitioning from a substantially liquid phase to a substantially solid phase in a narrow temperature range. In one particular embodiment of the invention, the phase change material is an organic material such as a wax that has a melting point between 60 degrees and 100 degrees centigrade. Even aqueous solutions may be used as a phase-change mask material when the substrate temperature is kept below the freezing point of the liquid. For example, water may be ejected onto a substrate that is maintained at a temperature below zero degrees centigrade.

The temperature of the substrate is maintained such that upon contact with the substrate, the liquid droplets of phase-change material is quenched and rapidly converts from a liquid state to a solid state. As will be further described, adjusting substrate temperature changes the quench rate. In one embodiment of the invention, the quench rate, and thus the substrate temperature is dynamically adjusted depending on the feature size to be printed. When smaller features are needed, the substrate surface is cooled even further below the freezing point of the phase change material resulting in a high quench rate. The high quench rate causes the droplet to freeze almost instantaneously upon contact with the substrate surface resulting in a small feature size. A larger feature size may be achieved by raising the substrate temperature to only slightly below the phase change material freezing point. The raised temperature lowers the quench rate such that the droplet spreads before freezing.

The difficulty of maintaining the substrate below the freezing point of the masking material is one criterion to be considered in determining what phase change material should be used. In some applications, the surface of the substrate is maintained at least 10 degrees below the freezing point of the phase-change masking material to assure rapid conversion from a liquid to a solid state. However, maintenance of the substrate at such temperatures may be undesirable or inconvenient for some semiconductor processes. For example, cooling and maintaining a substrate at negative 10 degrees centigrade throughout the deposition and subsequent etching process may interfere with the etching process. In such situations, organic materials are particularly convenient, because the melting point of such materials allows the substrate to be maintained at room temperature (approximately 30 degrees centigrade) and still meet the criteria of rapid freezing of the masking material after deposition on the surface to be etched. In particular, the approximately 60 degree melting point of many waxes is almost 30 degrees above a substrate maintained at a room temperature of 30 degrees. Due to the practicality of using phase change organics, the remainder of the specification will discuss using such materials in the deposition process, although it is to be understood that other phase change materials may be used.

After deposition of the phase-change masking material on a surface of the substrate, the substrate or thin film is etched resulting in removal of material not protected by the phase-change masking material. After etching of the substrate, the masking material is removed.

FIG. 1 shows a system 100 including a heat source 104 that heats a reservoir 108 of phase-change masking material to a temperature that is sufficient to maintain the phase change masking material in a liquid state. In one embodiment of the invention, the temperature of the reservoir is maintained above 100 degree centigrade and in some embodiments, at temperatures above 140 degrees centigrade, a temperature sufficient to liquefy most phase change organics.

As previously discussed, the phase-change masking material may be an organic media that melts at low temperatures. Other desirable characteristics of the phase-change masking material include that the masking material is non-reactive with inorganic materials used in typical semiconductor materials processing, and has a high selectivity to etchants. An alternate embodiment of the invention may also include a masking material suspended in a liquid. When liquid suspension is used, the substrate material is maintained above the boiling point of the liquid, and after deposition of the masking material, the liquid carrier evaporates upon contact with the substrate surface. When evaporation is used, the phase change process is directed from liquid to vapor, rather than from liquid to solid.

An additional characteristic of the phase-change masking material is that the resulting mask should be robust enough to withstand wet-chemical or dry etching processes. When a dry etching process is used, phase change masking materials with low-vapor pressures may be used. Wax is an example of a phase-change material with the previously described characteristics. Kemamide 180-based waxes from Crompton Corporation of Greenwich, Conn. is one example of a suitable wax for use as a phase-change masking material.

A plurality of droplet sources such as droplet source 112 receives the liquid phase-change marking material from reservoir 108 and outputs droplets 116 for deposition on a substrate 120. The substrate is typically a thin film of semiconductor material or a thin-film metal such as aluminum or chromium. The substrate may also be a dielectric. The substrate is maintained at a temperature such that the droplet cools rapidly after deposition. In some embodiments of the invention, a wetting agent, typically a dielectric material such as silicon dioxide, $SiO_2$ or silicon nitride, $Si_3N_4$ may be included on the surface to assure that sufficient wetting occurs to make a good contact between the mask and the substrate. Despite the enhanced wetting, the rate of cooling is sufficient such that the behavior of the droplet after contacting substrate 120 is controlled more by the cooling rate of the liquid than the wetting properties of the substrate surface to be etched.

The substrate temperature controls the rate of cooling. When increased coalescence between adjacent droplets is required, the substrate temperature can be increased to increase droplet spreading and thereby increase multiple droplet coalescence. When printing lines of Kemamide-based wax from an acoustic ink-jet printer, it has been found that increasing the substrate temperature from 30 degrees to 40 degrees centigrade improved the print quality of the mask. However, the temperature of the substrate is still kept low enough such that the droplet solidifies or rapidly "freezes" upon contacting substrate 120. Thus in the case of Kemamide-based wax, it was found that excellent results were achieved when the substrate was maintained at approximately 20 degrees centigrade below the freezing point of the wax.

In order to minimize the possibility of partial midair freezing of droplets in space 121 between droplet source 112 and substrate 120, an electric field 150 may be applied to accelerate the droplet from droplet source 112 to substrate 120. The electric field may be generated by applying a voltage, typically between one to three kilovolts between droplet source 112 and a platen 155 under substrate 120. The electric field minimizes droplet transit time through space 121 and allows substrate surface temperature to be the primary factor controlling the phase change operation. Moreover, the increased droplet velocity in space 121 improves the directionality of the droplet allowing for improved straight-line features.

After a droplet of marking material is deposited on substrate 120, the relative positions of the substrate and the droplet source are adjusted to reposition the droplet source over a second position to be masked. The repositioning operation may be achieved either by moving droplet source 112 or by moving substrate 120. In the illustrated embodiment, a control circuit 124 moves droplet source 112 in a predetermined pattern over substrate 120. A driver circuit 128 provides energy to droplet source 112 causing ejection of droplets when droplet source 112 is positioned over a region of substrate 120 to be masked. By coordinating the movement of droplet source 112 with the timing of droplet source outputs, a masking pattern can be "printed" on the substrate.

As each drop is printed, a feedback system may be used to assure droplets of proper size. An imaging system, such as camera 160, may be used to monitor droplet size. When smaller features are to be printed, or the droplet size otherwise reduced, a temperature control circuit 123 lowers the temperature of a surface of substrate 120. The lower temperature increases the quench rate resulting in rapid solidification of the phase change masking material upon contact with substrate 120. When larger droplets are needed, usually for merging droplets in larger features, temperature control circuit 123 raises the temperature of substrate 120. In one embodiment of the invention, temperature control circuit 123 includes a heating element thermally coupled to substrate 120 such that ambienfheating of media around the substrate is minimized.

In one embodiment of the invention, the phase change material is a solid at temperatures below approximately 60 degrees centigrade. In such embodiments, it may be unnecessary to cool the substrate below room temperature because as previously described, a sufficiently small droplet cools rapidly when a 20 degree temperature differential is maintained between the freezing point of the phase change material and the substrate temperature. In such cases, the temperature control circuit may merely be a sensor and a heater that raises the substrate slightly above room temperature when larger feature sizes are to be printed.

In order to control and align the movement of droplet source 112, printed alignment marks, such as mark 113, patterned from a previous mask layer may be used to coordinate the next overlying mask layer. An image processing system such as the previously described camera may be used to capture the orientation of the previous mask layer. A processing system then adjusts the position of the overlying mask layer by altering the mask image file before actual printing of the mask layer. In this way, the substrate remains fixed and mechanical movement of the substrate holder is unnecessary. Instead positioning adjustment are accomplished in software and translated to movements of droplet source 112.

Although the alignment has been described in terms of controlled movement of the droplet source, any method that controls relative movement of the droplet source with respect to the substrate may be used. Thus, in one embodiment of the invention, the droplet source may be maintained in a fixed position and the substrate moved to align with the alignment marks and control the position of the deposited droplets. Still a third embodiment allows controlled movement of both the substrate and the droplet source to properly align and place droplets of a masking material.

Figure 2:
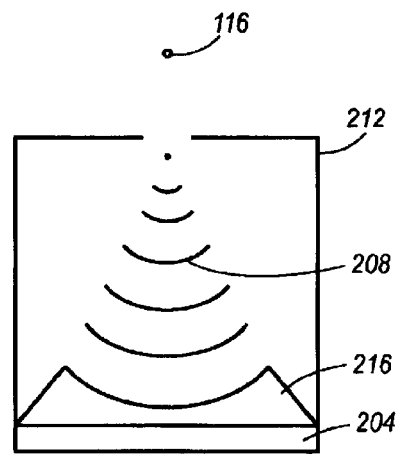
FIG. 2 shows one embodiment of a droplet source used in the system of FIG. 1. to eject a phase-change material onto a substrate.

Each droplet source may be implemented using a variety of technologies including traditional ink-jet technology. An alternative technology well suited for generating extremely small droplet sizes is the use of sound waves to cause ejection of droplets of masking material as done in acoustic ink printing systems. FIG. 2 shows one embodiment of an acoustic droplet source 200 implemented using acoustic ink printing technology.

In FIG. 2, a source of acoustic waves such as piezo electric driver 204 generates acoustic waves 208 in a pool 212 of phase change masking material. Acoustic lens 216 focuses the acoustic waves such that a droplet of phase change masking material is ejected from the surface of pool 212. The droplet is deposited on substrate 120 of FIG. 1.

Figure 3:
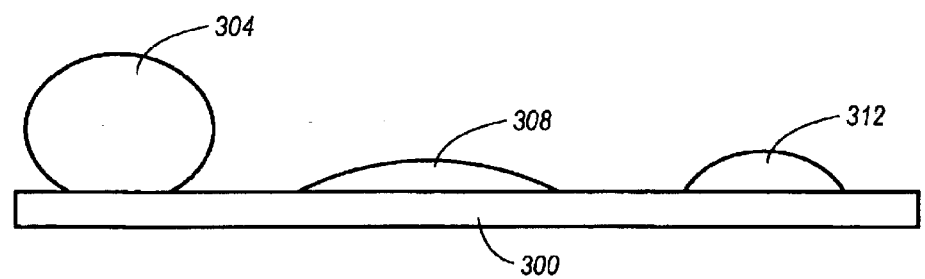
FIG. 3 is a side view of several droplets as a function of the amount of wetting that occurs.

FIG. 3 shows a side view of printed droplets 304, 308, 312. First droplet 304 illustrates the shape of the droplet when insufficient wetting occurs. The droplet is almost entirely round resulting in minimal contact area 306 between substrate 300 and first droplet 304. The minimal contact area produces poor adhesion between droplet 304 and substrate 300.

Second droplet 308 illustrates the effect of excessive wetting. When excessive wetting occurs, the droplet is almost planar with the surface of substrate 300. Although adhesion is excellent, the spreading results in large feature sizes. Third droplet 312 illustrates a droplet under proper wetting conditions. Third droplet 312 adheres tightly to the substrate 300 while still maintaining reasonable curvature associated with smaller droplet areas used to mask smaller features.

Figure 4:
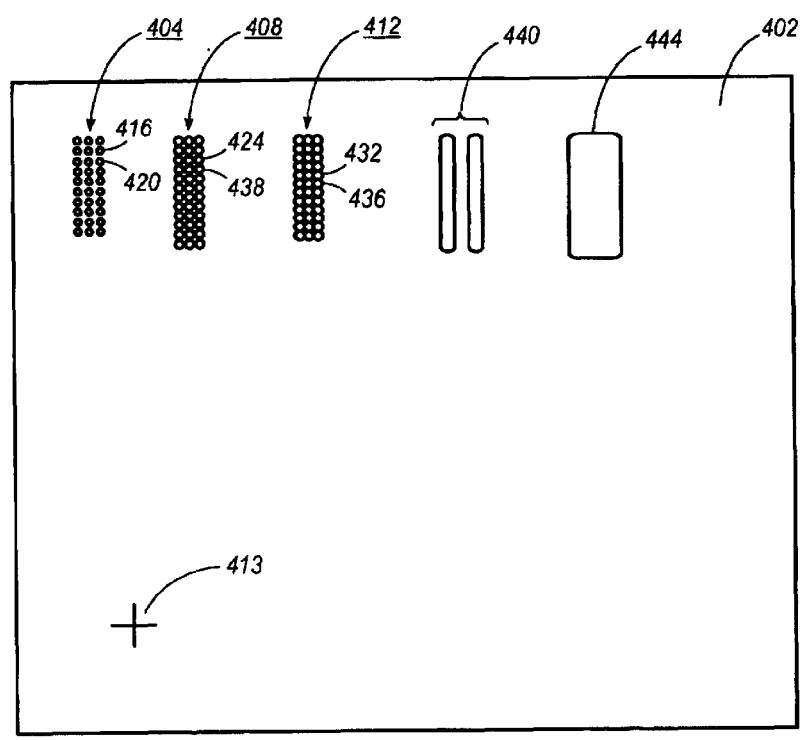
FIG. 4 is a top level view of a line formed by ejecting droplets of phase change material.

FIG. 4 shows a top view 400 of a substrate 402 with three printed lines 404, 408, 412 of printed phase change organic masking material. The first line 404 is printed while the substrate is at a first lowest temperature of approximately 30 degrees centigrade, the second line 408 at a second middle temperature of approximately 40 degrees centigrade, and the third line 412 is printed while the substrate is at a high temperature of approximately 50 degrees centigrade. At the first temperature, droplets 416, 420 are at the smallest size. At the middle temperature in line 408, droplets 424, 428 spread to merge together and form a line. At the high substrate temperatures used in printing line 412, excessive spreading results in undesirably large droplets as exemplified by droplets 432, 436. Further raising the temperature of substrate 402 can result in the droplets combining to form continuous lines 440. Excessively high substrate temperatures can result in merging of lines to create pads 444.

Figure 5:
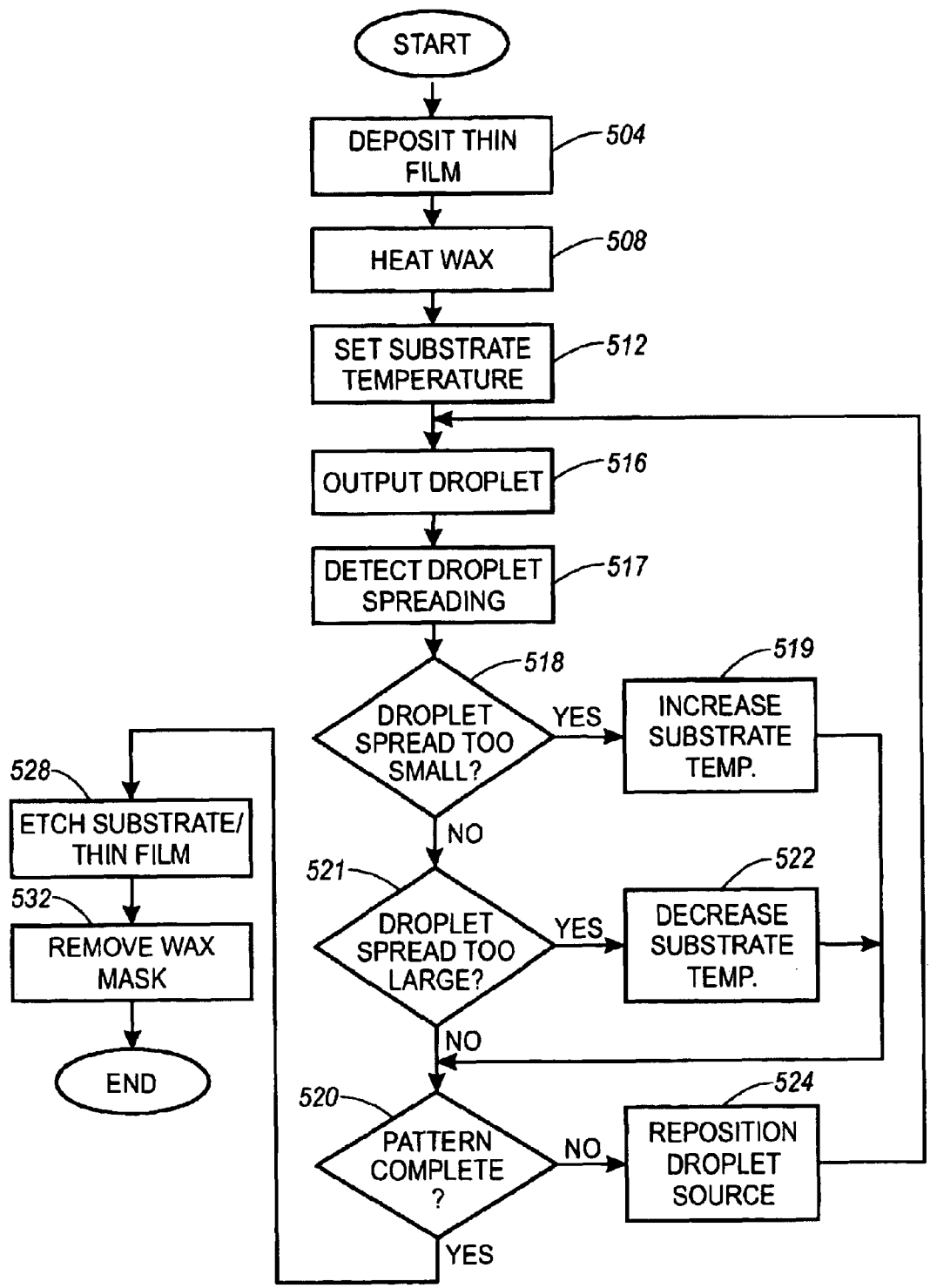
FIG. 5 is a flow chart showing the operations involved in using a phase change masking material in a direct mask process.

FIG. 5 is a flow diagram 500 showing the operations involved in patterning a surface using a direct mask process. In block 504, a thin film that acts as a substrate to be patterned is deposited over a support structure. The phase-change material, in this case a wax is then printed over the thin film. Blocks 508 to 524 define this printing process.

In block 508, the wax is heated to a temperature sufficient to liquefy the phase-change material. The substrate is also heated to an optimal temperature as described in block 512. The optimal substrate temperature causes rapid "freezing" of ejected droplets that contact the thin-film surface. The actual optimal temperature is typically determined by the desired feature size, smaller feature sizes will result in a lower substrate temperature to produce a higher quench rate.

In block 516, a droplet source outputs a droplet of the phase-change material. The droplet source output may be generated by using piezo-electric transducers to generate acoustic waves that cause ejection of a droplet. Alternate embodiments use combined methods of ink-jet printing technology to cause ejection of a droplet. Examples of ink-jet printing technology include piezoelectric and thermal ink-jet technologies. However, the process is not limited to these types of printheads, rather the phase-change material may be dispensed by any conventional droplet ejection technique. The droplet is directed towards and deposited upon the thin-film or the substrate surface.

In some embodiments, a feedback loop may be used to determine if the deposited droplet is properly spread over the substrate. In such embodiments, a detection system, such as a camera in an imaging system, determines the amount of droplet spreading that occurred after deposition as described in block 517. When in block 518, it is determined that the droplet size spreading is insufficient, resulting in a coverage area that is too small, the substrate temperature is increased in block 519. When in block 521, it is determined that the droplet size spreading is excessive, resulting in a coverage area that is too large, the substrate temperature is reduced in block 522.

In block 520, circuitry that controls movement of the droplet source determines if the masking pattern has been completely printed. When the pattern has not been completely printed, the droplet source is repositioned in block 524. The operations of repositioning and ejecting of droplets described in block 516 and block 524 continues until control circuitry determines in block 520 that the complete pattern has been printed.

After printing of the pattern, the thin film layer is etched in block 528. Etching removes portions of the thin film not protected by the mask. The etching may be accomplished using a variety of acids and solvents common in thin-film semiconductor processing. After the etching of the thin-film layer, the masking layer may be removed as shown in block 532 using organic solvents such as tetrahydrofuran (THF).

Figure 6:
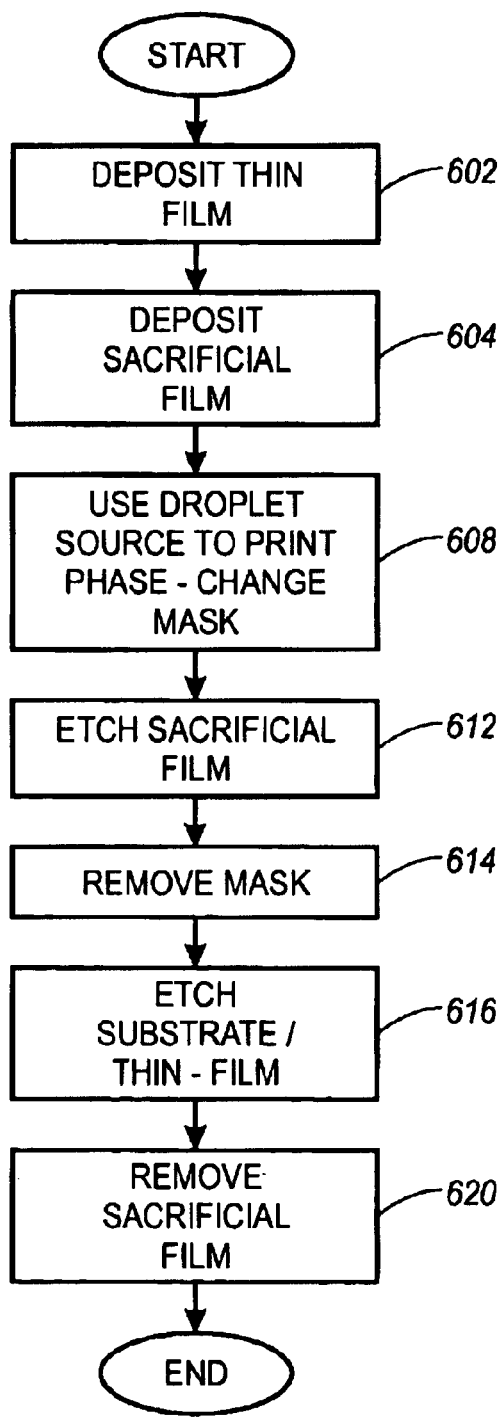
FIG. 6 is a flow chart showing the operations when using a phase change masking material in a sacrificial layer patterning of a substrate.

The procedure described in FIG. 5 allows for rapid direct marking. However, in some applications, the substrate to be patterned may be damaged by the phase-change masking layer. Alternately, the phase-change masking layer may not properly adhere to or coat the substrate to be patterned. In such instances, a sacrificial mask layer can be fabricated between the substrate to be etched and the phase-change material to avoid damaging the substrate or thin film surface to be patterned. The sacrificial mask layer is then patterned and serves as a mask for the substrate or thin film beneath it. Flow chart 600 of FIG. 6 describes one embodiment of a sacrificial mask process.

In block 602 a thin-film to be etched is deposited and acts as a substrate to be patterned and etched. In block 604 of FIG. 6, a thin-film sacrificial layer is deposited over the substrate to be patterned. An example of a typical sacrificial layer material is aluminum or chromium. In one embodiment, the thin-film layer is between 100 and 300 nanometers thick. A phase-change material is printed over the sacrificial layer in block 608. The printing process uses a droplet source to deposit droplets of phase-change material similar to the procedure described in block 504 to block 524 of FIG. 5.

In block 612, the thin film sacrificial layer is etched using an acid such as a mixture of sulfuric and phosphoric acid. After the thin-film sacrificial layer has been patterned, a second solvent etches the substrate in block 616 to remove the phase-change printed mask. The sacrificial layer such as aluminum, defined by the printed phase-change mask material, then serves as a mask during the substrate etching process. After the substrate has been etched, the sacrificial layer is removed in block 620 using a removal compound such as a mixture of sulfuric and phosphoric acid. In other applications, the phase-change mask and the sacrificial layer may be used in combination to mask the underlying substrate surface during the etch process. Removal of the sacrificial layer usually includes removal of the phase-change material protecting the sacrificial layer. The removal of the phase-change material may precede or be concurrent with the removal of the sacrificial layer.

A third application of the phase-change mask material uses the phase-change mask in a photolithographic process. In the described process, printed phase-change masking material replaces the conventional aligner-plate mask traditionally used in photolithographic systems. Using a printed phase-change material such as wax instead of an aligner-plate avoids the need for a stepper/aligner to expose the patterned feature. Furthermore, the approach provides flexibility when compared to the direct masking processes described in FIG. 5 and FIG. 6 by providing a negative resist capability that allows masking of areas to be removed rather than masking of areas that are not to be etched. Such a capability is particularly useful when most of the substrate is to remain, and only small areas are to be removed.

Figure 7:
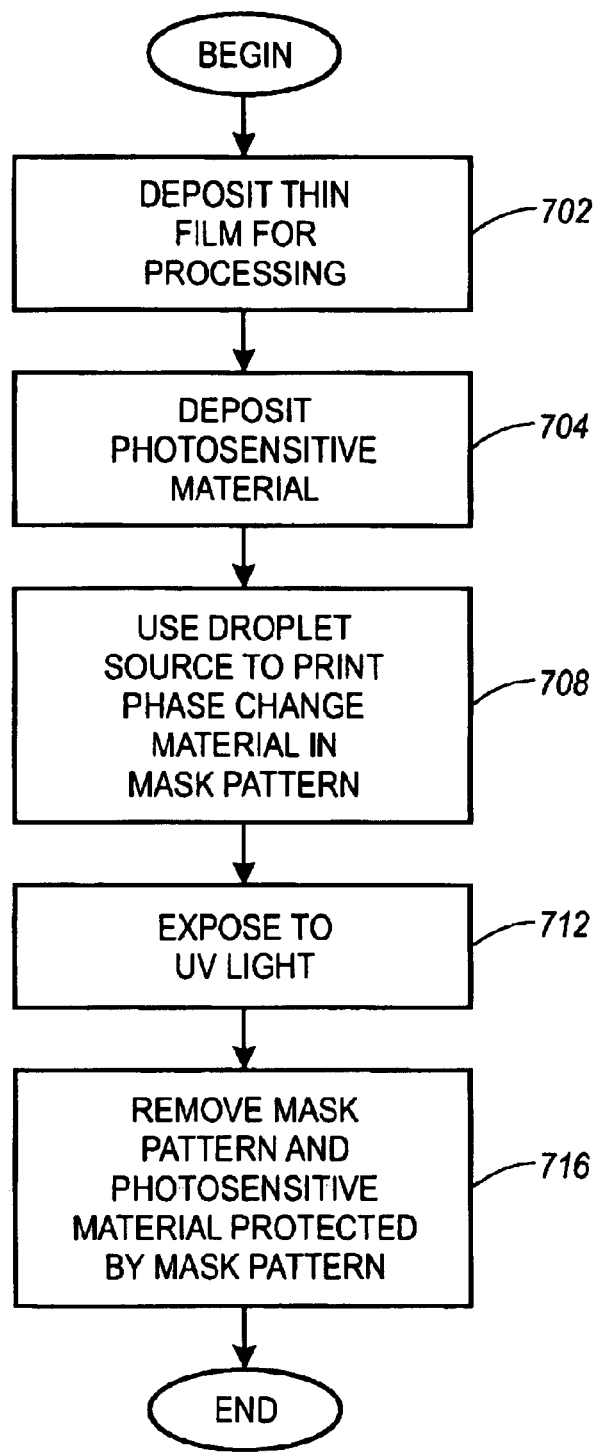
FIG. 7 is a flow chart showing the operations when using a phase change masking material in a photolithographic process.

FIG. 7 shows a flow chart using the phase change mask material in a photolithographic process. In block 704 of FIG. 7, a coating of photosensitive material is deposited on a substrate to be patterned. In one embodiment of the invention, the photosensitive material is a spin-on polymer such as SU-8. A phase change material is printed over the polymer layer in block 708. The printing process uses a droplet source to deposit droplets of phase change material similar to the procedure described in block 504 to block 524 of FIG. 5.

After printing, the surface of the polymer is exposed to ultraviolet light in block 712. The ultraviolet light defines the polymer causing the polymer to transform and crosslink allowing the masked regions to be removed. After processing of the polymer, the mask pattern is removed in block 716. The material protected by the mask pattern is also removed. In one embodiment of the invention, a tetrahydrafuran (THF) solution removes the mask pattern while allowing the SU8 to remain.

Large display systems are typically composed of pixels. As used herein, a pixel is defined to be the smallest addressable unit in a display typically including, but not limited to, a thin-film transistor (TFT), or sensor, or other emissive element. Pixels in large display systems typically have dimensions of approximately 0.3 mm and above. For example, a 27 inch diagonal monitor with a 500 line resolution corresponds to a pixel size of approximately 1 mm. Assuming a three or four-color sub-pixel design, the pixel size drops to around 0.5 mm. Increasing the resolution, for example in HDTV systems results in a need for smaller pixels. Conversely, larger screen sizes can utilize larger pixel sizes.

Although different pixel geometries are possible, a typical three color AMLCD sub-pixel is rectangular; thus for purposes of the following discussion, an example 200×600 micron pixel which would typically be used in a 1000 line display will be described. Assuming an aperture ratio of approximately 40%, a typical liquid crystal has a capacitance of about 1.5 pF. In order to match the capacitance of the pixel to the AMLCD, the capacitance of the pixel is also often around 1.5 pF thereby creating a system with a total capacitance of approximately 3 pF. When a 1000 line array is operated at a rate of 60 Hz, each line should be allocated a 16 microsecond cycle time; or a maximum pixel readout time constant of approximately 4 microseconds to fully charge or discharge a pixel. In order to meet the 4 microsecond time constant, the on-resistance of the pixel TFT should be around 1.3 Mohms. Because amorphous silicon has a mobility of approximately 0.8 $cm^2/Vsec$, a suitable width-to-length ratio of a TFT used in the above described system is approximately 4.

Figure 8:
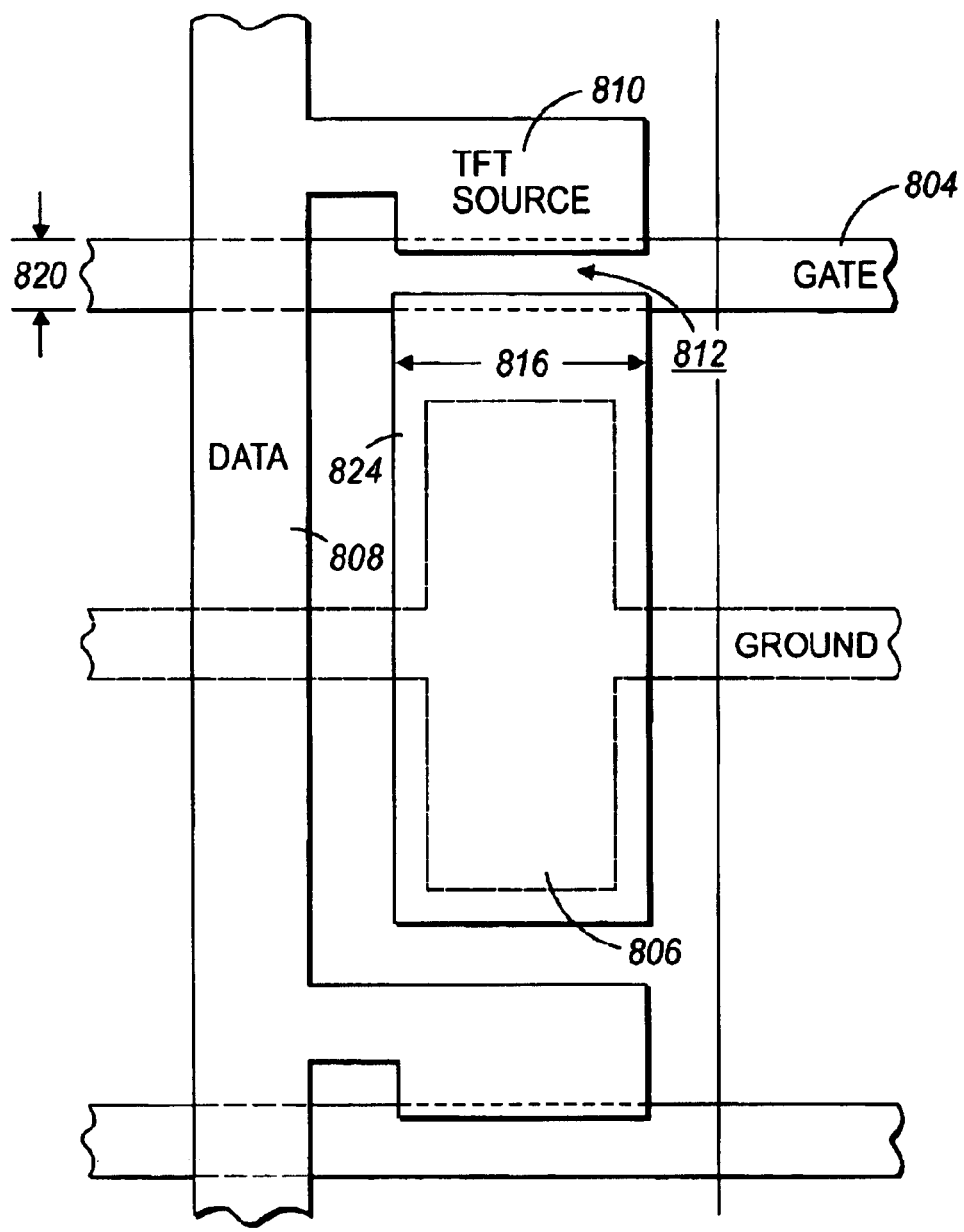
FIG. 8 shows one example of an AMLCD cell structure.
Figure 9:
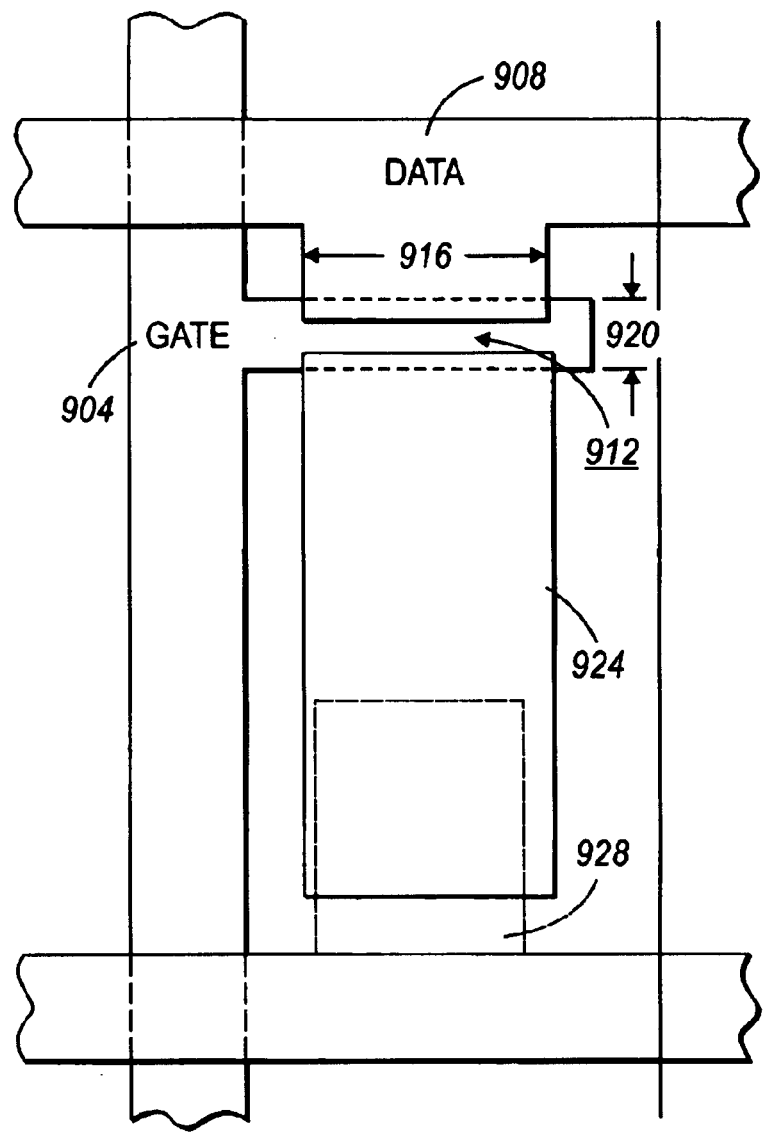
FIG. 9 shows a second example of an AMLCD cell structure.

FIG. 8 shows a first example and FIG. 9 shows a second example structure of possible AMLCD cell structures for the above-described system. These structures are replicated in a typical display system to form an array of such cell structures that form a typical display system. Both example structures are designed to fit into apertures of 120×400 microns and may be fabricated from systems that are capable of printing minimum mask features of 30 microns with minimum line separations of 20 microns and layer-to-layer registrations of 5 microns. The preceding example structures have been provided to illustrate possible structural designs of pixels having 20 micron features sizes configured to fit in 120 micron areas. However, it should be understood that the described methods may be used to form other layouts that also involve fabricating multiple layers properly aligned to form the structures of a pixel. Further development of printing technology will continue to improve these feature resolutions allowing the fabrication of smaller pixels.

In FIG. 8, gate 804 and ground plate 806 are formed in a first plane from a first metal layer. The metal layer from which the gate 804 and ground plate 806 is patterned by using a phase change mask deposited to rapidly freeze on contact with the metal, and subsequent etching of the first metal layer as will be described in the flow chart of FIG. 11. After formation of gate 804, and ground plate 806, the active region of the TFT, typically including a dielectric stack and an amorphous silicon layer is deposited over gate 804 and ground plate 806.

A second metal layer is deposited over dielectric stack and amorphous silicon layer. From the second metal layer, a source 810, a data line 808 to address source 810, and a drain 824 are formed. Formation of the source, data line and drain is typically also done by using a deposited phase-change mask that rapidly freezes after deposition on the second metal layer as explained further in the flow chart of FIG. 11. After deposition of the phase change mask, the second metal layer is etched to form source 810, data line 808 and drain 824.

The dimensions of the various elements may vary depending on the printing technology used and the size of the pixel desired. By way of example, gate 804 has a length 820 of approximately 30 microns and a width 816 of approximately 120 microns providing a width to length ratio of approximately four. Likewise, data line 808 a width of approximately 30 microns. 30 microns is the approximate minimum feature resolution of current jet printing systems.

Drain 824, which is in the plane of source 810, and a ground plate 806 together sandwich a dielectric such that an amorphous silicon layer is "sandwiched" between two dielectric layers. In one embodiment, ground plate 806 has dimension of approximately 80×250 microns. The combination of drain 824, dielectric, and ground plate 806 together from a storage capacitor. The storage capacitor stores charge to allow the pixel corresponding to the TFT to maintain a charge as the circuitry addresses other pixels in the array, typically during a scan of the display.

FIG. 9 is an alternate structural configuration for a TFT 912 to be used in a display system. The TFT of FIG. 9 is similarly dimensioned to fit into the 120×400 micron aperture. In FIG. 9, gate 904 and data line 908 are also formed to have a width of approximately 30 microns. TFT 912 is also sized to have a width 916 of approximately 120 microns and a length 920 of approximately 30 microns. Drain 924 and a ground plate 928 together form a storage capacitor to enable charge to be maintained as the address circuitry addresses different pixels in the array.

Figure 10:
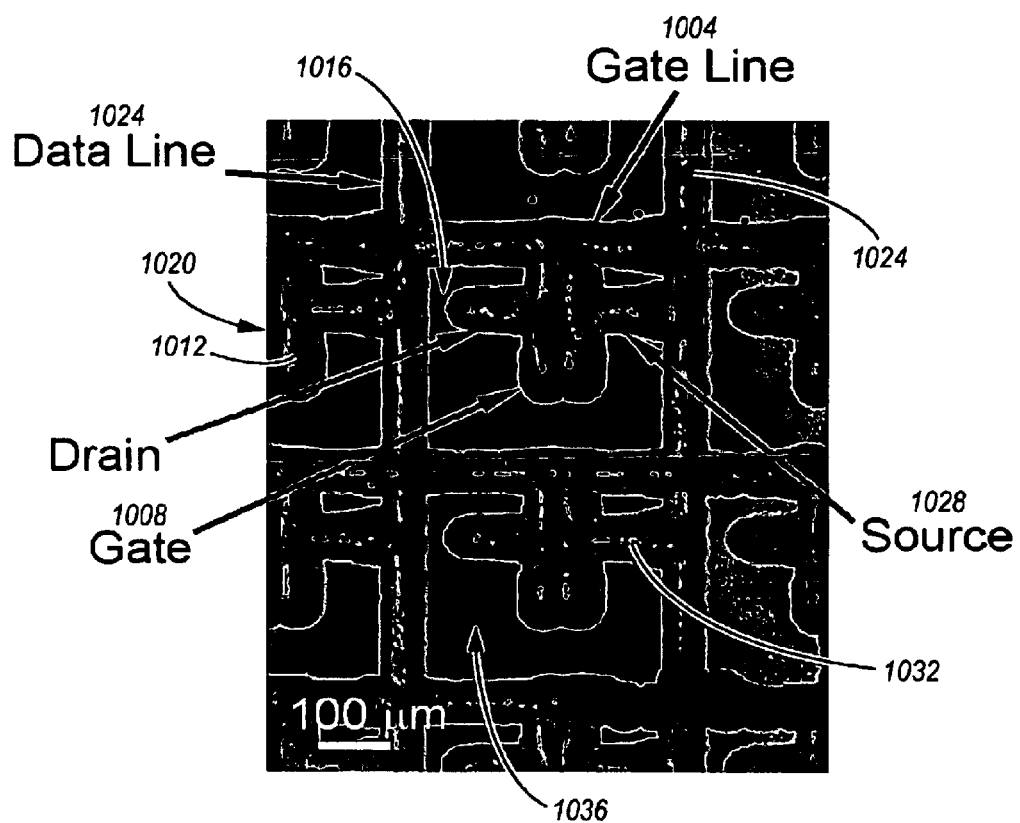
FIG. 10 shows a small portion of a two dimensional array of pixels for use in a display.

FIG. 10 is micrograph image showing a wax pattern that would typically be deposited at different times and in different layers to form an array of pixels. For purposes of illustration, the wax that would be deposited in different layers has been deposited in a single layer to show the features of the pixel that would be formed, for example gate line 1004 addresses a plurality of gates 1008, 1012 in corresponding pixels 1016, 1020. Likewise, each data line 1024 addresses a plurality of sources 1028, 1032 in corresponding pixels 1016, 1036. The source lines and data lines are coupled to processing circuitry (not shown) used to drive the display system.

Figure 11:
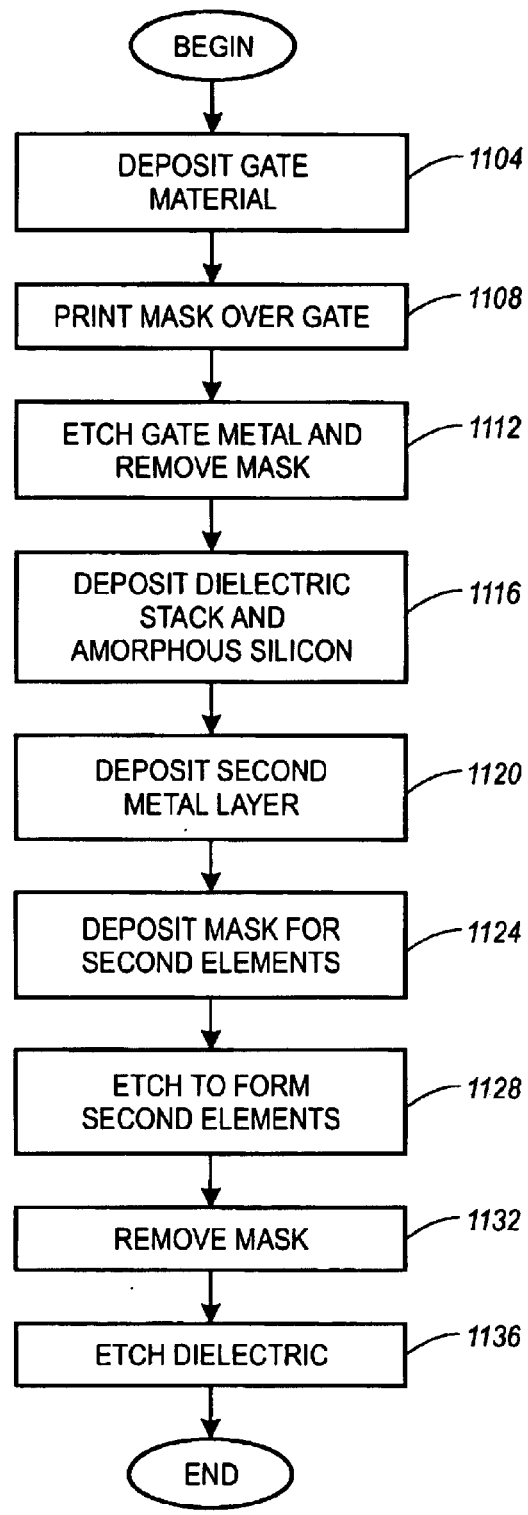
FIG. 11 is a flow chart that shows the steps used to fabricate the AMLCD cell of FIG. 8.

FIG. 11 is a flow chart that describes one method of forming the TFTs shown in FIG. 8. In block 1104, a gate metal layer is deposited. A mask, typically a phase change material, is printed over the gate area in block 1108. In an alternate embodiment, the mask may be formed from a masking material suspended in a liquid carrier that boils off upon contact with the substrate. Besides the gate, the mask is also deposited over other first elements to be formed from the gate metal layer, such as the ground plate in the structure of FIG. 8. Printing may be done using a piezo-electric jet printer head and controlling the temperature of the gate metal as previously described. After the mask freezes, the gate metal is etched in block 1112 to form the TFT gate as well as other elements such as the ground plate. The masking material, typically a phase change wax material is then removed.

In block 1116, a dielectric stack, including a layer of amorphous silicon sandwiched between two dielectric layers, is formed over the gate metal to form the active region of the TFT. Formation of the dielectric stack usually involves deposition of a first bottom dielectric followed by deposition of an amorphous silicon layer. A variety of deposition techniques may be used to deposit the layer including, but not limited to plasma enhanced chemical vapor deposition (PECVD). A top dielectric is then be deposited over the amorphous silicon layer. The top dielectric layer is defined to enable access to the amorphous silicon layer. One method of accessing the top dielectric layer is to deposit a second mask and etch pattern the top dielectric. A highly doped amorphous silicon layer is deposited followed by deposition of a conductive metal to create an ohmic contact with the amorphous silicon layer.

A second metal layer is deposited in block 1120. The metal in the second metal layer forms second elements of the two dimensional circuit. In forming the example structure of FIG. 8, the second elements may include the TFT source, the TFT drain as well as an interconnecting data line.

A third mask patterned to protect and form the second elements in the two dimensional circuit is deposited in block 1124. Alignment of the second mask with the first elements in the two dimensional circuit, typically the gate, may be done by sensing the position of the gate prior to deposition of droplets corresponding to the second mask. One method of controlling the position of the droplet source uses a camera to detect the position of the gate. A control circuit uses the information from the camera to control the position of a droplet source and properly position droplets forming the second mask in relation to the gate. A more detailed description of one implementation of the alignment procedure is provided in the description accompanying FIG. 1. In one embodiment of the invention, the second mask is also a phase-change wax mask that freezes on contact with the substrate or metal. The wax mask protects these second elements during an etching process as shown in block 1128. After completion of the etching, the mask is removed in block 1132. An organic solvent may be used to remove the mask.

In order to isolate the individual pixels in the array and minimize cross talk between the array of devices, it may be advantageous to etch portions of the dielectric stack and semiconductor as shown in block 1136. In the example of FIG. 8, the second elements of the TFT may serve as a mask in etching portions of the dielectric stack. After fabrication of the TFT array, other components of the display, including color filters and the display back plane are formed. These components may also be formed by jet printing a phase change masking material and subsequently etching the resulting structure. Finally, after completion of the elements of the display device, the address lines that address each TFT may be coupled to control electronics and a power source that provides power to and controls illumination of the pixels in the display device.

Figure 12:
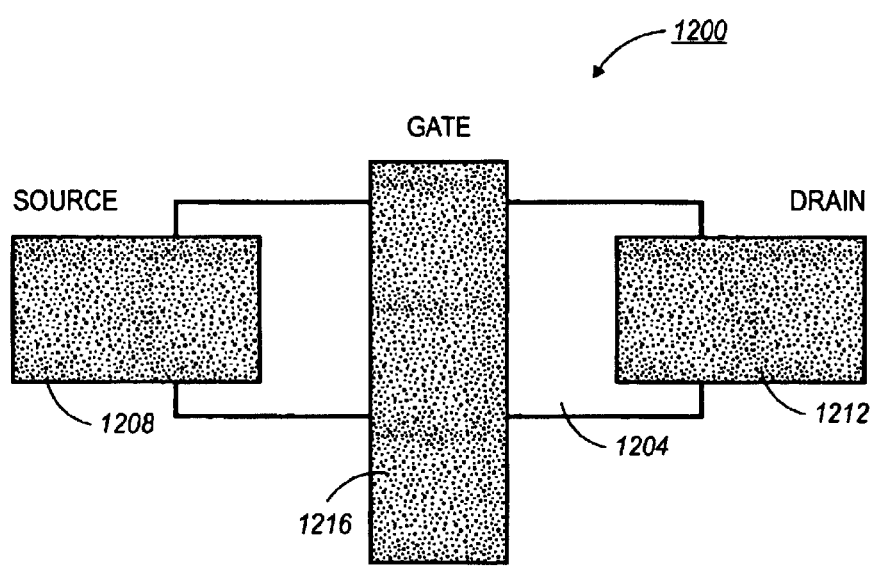
FIG. 12 is an illustration of an example polysilicon TFT structure.

FIG. 12 shows an example polysilicon TFT structure 1200 that may be fabricated using the wax-resist patterning process described herein. In FIG. 12, a polysilicon active region 1204 is positioned between source 1208 and drain 1212. Other than the wax masking techniques used to form the TFT features, the polysilicon structure is otherwise formed using traditional fabrication techniques including laser recrystalization to form the polysilicon and ion-implantation to provide dopants to the polysilicon. In normal operation, charge placed on gate 1216 switches the TFT structure 1204 between "on" and "off" states. Typical dimensions for such a TFT may be approximately 100×50 microns, which allows the addressing electronics to fit with a 200×600 micron pixel.

Although the described designs have been presented as display devices, and more specifically, the TFTs and address lines of the display device, the described patterning processes may also be used to form other parts of the display including, but not limited to color filters used in a display and a display back plane. The described technique may also be used to form other two dimensional pixel array devices, such as sensors. Inage sensor pixel circuits are generally similar to those used for AMLCDs. When X-rays are being detected, a phosphorous layer may be deposited over the sensor to convert the X-rays into light photons for detection by the sensor.

Current printing technology enables the fabrication of larger pixels that are suitable for medical imaging applications. For example, fluoroscopy often uses pixels sized above 250 microns. Cone-beam computed tomography and radiation therapy imaging often uses pixel sized above 500 microns. As printing technology improves enabling the fabrication of smaller pixels, additional applications for the sensor will become available.

It should be understood that the foregoing description is intended to be illustrative of the invention. Variations and modification of the descriptions provided herein will present themselves to those skilled in the art. For example, the description has identified example dimensions, particular TFT structures, and examples of phase-change materials. However, other methods, other phase-change materials, and other structures may also be formed. Accordingly, the present description should not be read as limiting the scope of the invention except as described in the claims that follow.

What is claimed is:

1. A method of patterning an element for a two dimensional pixel circuit comprising the operations of:

maintaining a surface to be patterned below the freezing temperature of a phase-change masking material;

ejecting droplets of the phase change masking material onto the surface in a pattern matching the element for the two dimensional pixel circuit, the droplets changing from a liquid to a solid after contact with the surface;

etching the surface to remove material from around the element for the two dimensional pixel circuit.

2. The method of claim 1 wherein the two-dimensional pixel circuit is a display.

3. The method of claim 1 wherein the two dimensional pixel circuit is a sensor.

4. The method of claim 1 wherein the two dimensional pixel circuit is an active matrix-addressed array.

5. The method of claim 1 wherein the element for the two-dimensional pixel circuit is a gate of a transistor.

6. The method of claim 1 wherein the element for the two-dimensional pixel circuit is an address line.

7. The method of claim 1 wherein the element for the two-dimensional pixel circuit is a source contact of a thin film transistor.

8. The method of claim 1 wherein the element for the two-dimensional pixel circuit is a drain contact of a thin film transistor.

9. The method of claim 1 further comprising the operations of: removing the phase-change material from the surface.

10. The method of claim 9 further comprising the operation of:

depositing a semiconductor and dielectric stack over the element for the two dimensional pixel circuit; and, forming a second element for the two dimensional pixel circuit over the semiconductor and dielectric stack.

11. The method of claim 10 wherein the forming of the second element for the two dimensional pixel circuit further comprises the operations of:

depositing a metal layer over the semiconductor and dielectric stack;

printing a mask matching the shape of the second element; and, etching the metal layer to remove material from around the second element of the two-dimensional pixel circuit.

12. The method of claim 11 wherein the second element of the two dimensional pixel circuit is a source contact.

13. The method of claim 11 wherein the second element of the two dimensional pixel circuit is a drain contact.

14. The method of claim 1 wherein the surface to be etched is maintained at approximately room temperature, and the phase change material is heated prior to the operation of ejecting in liquid form.

15. The method of claim 14 wherein the phase change material is an organic phase change material.

16. The method of claim 15 wherein the phase change material is a wax.

17. The method of claim 1 wherein the operation of ejecting further comprises:

generating acoustic waves in a reservoir of the phase change material to eject said droplets.

18. The method of claim 1 wherein the operation of ejecting further comprises:

utilizing a piezoelectric to generate waves in a reservoir of the phase change material to eject said droplets.

19. The method of claim 9 wherein the forming of the second element for the two-dimensional pixel circuit further comprises the operations of:

depositing a dielectric and amorphous silicon stack layer over the element for the two dimensional pixel circuit;

depositing a metal layer over the dielectric and amorphous silicon stack layer;

detecting alignment marks used to determine an orientation and position of the element of the two dimensional pixel circuit;

using the orientation and position of the element to control movement of a droplet source ejecting droplets to print a mask matching the orientation, shape and position of the second element; and, etching the metal layer to remove material from around the second element of the two dimensional pixel circuit.

20. The method of claim 19 wherein the operation of detecting the alignment mark further comprises the operation of:

using a camera to sense the position of the alignment mark.

21. The method of claim 20 wherein the alignment mark is the element of the two-dimensional pixel circuit.

22. The method of claim 21 wherein the element of the two dimensional pixel circuit is a gate of a TFT.

23. The method of claim 1 wherein the phase-change material is a liquid at temperatures above 60 degrees centigrade and a solid at room temperature.

24. The method of claim 1 further comprising the operation of:

detecting an amount of spreading after deposition of a droplet of the phase change masking material on the surface to be etched; and adjusting the temperature of the substrate prior to deposition of a subsequent droplet.

25. The method of claim 1 wherein the two-dimensional pixel circuit is a passive matrix circuit.

26. The method of claim 1 further comprising the operation of:

coupling control circuitry and a power supply to an address line coupled to the element of the two dimensional pixel circuit.

27. A method of masking a component in an array of electronic devices comprising the operations of:

maintaining a temperature of a surface to be etched above the boiling point of a liquid carrier, said liquid carrier including a suspended masking material;

ejecting in liquid form droplets of a solution including the liquid carrier and suspended masking material in a pattern matching the element for the array of electronic devices, the liquid carrier rapidly evaporating after contact with the surface leaving the masking material to form a first mask;

etching the surface to remove material from around said the element for the two dimensional pixel circuit.

28. A method of patterning an element of an array of electronic devices comprising the operations of:

maintaining a surface to be patterned below the freezing temperature of a phase-change masking material;

ejecting droplets of the phase change masking material onto the surface in a pattern matching the element for the array of electronic devices, the droplets changing from a liquid to a solid after contact with the surface;

etching the surface to remove material from around the element for the array of electronic devices; and, removing the masking material.

29. The method of claim 28 wherein the array of electronic devices forms a display.

30. The method of claim 28 wherein the element being formed is a component of a thin film transistor.

* * * * *

UNITED STATES PATENT AND TRADEMARK OFFICE
CERTIFICATE OF CORRECTION

| | | |
|---|---|---|
| PATENT NO. | : 7,033,516 B2 | Page 1 of 1 |
| APPLICATION NO. | : 10/334595 | |
| DATED | : April 25, 2006 | |
| INVENTOR(S) | : William S. Wong et al. | |

It is certified that error appears in the above-identified patent and that said Letters Patent is hereby corrected as shown below:

Column 1, line 14, insert as a new paragraph:

This invention was made with Government support under 70NANB7H3007 awarded by NIST. The Government has certain rights in this invention.

Signed and Sealed this

First Day of May, 2007

JON W. DUDAS
*Director of the United States Patent and Trademark Office*